(12) United States Patent
Doyle (10) Patent No.: US 7,595,642 B2
(45) Date of Patent: Sep. 29, 2009

(54) BATTERY MANAGEMENT SYSTEM FOR DETERMINING BATTERY CHARGE SUFFICIENCY FOR A TASK

(75) Inventor: Thomas F. Doyle, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 55 days.

(21) Appl. No.: 11/345,808

(22) Filed: Feb. 1, 2006

(65) Prior Publication Data
US 2007/0182376 A1    Aug. 9, 2007

(51) Int. Cl.
*G01N 27/416* (2006.01)

(52) U.S. Cl. .............. 324/426; 320/132; 340/7.32; 340/7.37

(58) Field of Classification Search ........... 324/426, 324/435; 320/132, 134, 136; 340/7.32, 7.37, 340/693.3
See application file for complete search history.

(56) References Cited

U.S. PATENT DOCUMENTS

| | | | |
|---|---|---|---|
| 4,380,726 A | 4/1983 | Sado et al. | |
| 5,065,084 A | 11/1991 | Oogita | |
| 5,572,110 A * | 11/1996 | Dunstan | 320/106 |
| 5,798,702 A * | 8/1998 | Okamoto et al. | 340/636.1 |
| 6,008,732 A * | 12/1999 | Lam | 340/815.4 |
| 6,331,761 B1 * | 12/2001 | Kumar et al. | 320/132 |
| 6,532,425 B1 * | 3/2003 | Boost et al. | 702/63 |
| 6,717,520 B1 * | 4/2004 | Dorenbosch | 340/636.1 |
| 6,870,349 B2 * | 3/2005 | Cook | 320/132 |
| 2001/0022518 A1 * | 9/2001 | Asakura et al. | 324/426 |
| 2004/0046565 A1 | 3/2004 | Ingesson et al. | |

FOREIGN PATENT DOCUMENTS

EP    0854583 A1    7/1998

* cited by examiner

*Primary Examiner*—Akm E Ullah
*Assistant Examiner*—Arun Williams
(74) *Attorney, Agent, or Firm*—Robert J. O'Connell; Ashish L. Patel (57) ABSTRACT

An electronic tool and method to manage a battery includes a processor to monitor a battery charge and estimate a required charge needed by the electronic tool to complete any task or job shift. When the processor determines the battery charge is insufficient, the processor applies business rules to reduce and terminate functions of the electronic tool to conserve power.

37 Claims, 5 Drawing Sheets

BATTERY MANAGEMENT SYSTEM FOR DETERMINING BATTERY CHARGE SUFFICIENCY FOR A TASK

BACKGROUND

1. Field

Disclosed is methods, apparatuses, and systems relating to battery powered handheld units and, more particularly to battery management of the handheld or portable unit.

2. Background

In today's work environment, the average worker has access to numerous electronic tools to facilitate the worker's job. These electronic tools are often essential to the performance of the job, but almost always increase the worker's efficiency. Some tools are simple communication devices, such as, for example, pagers or the like. Other tools are more complex processing devices, such as, for example, handheld computing devices.

Frequently, the electronic tools or assets are owned by the employer. The employer provides a bank of units at a central dispatch center where the employee first arrives at work. The bank of units typically reside in a charging device to ensure the electronic tool has a fully or near fully charged battery. The worker, on arriving at the dispatch center, picks up the electronic tool and departs for the job site. The worker may stay on a particular job site for an entire shift or travel from site to site over the course of a shift. The worker typically does not return to the dispatch center until the end of the shift. At the end of the shift, the worker returns to the dispatch center and turns in the electronic tool.

The dispatch center receives the tool and puts the electronic tool in a recharge device for a predetermined amount of time. Once that predetermined amount of time lapses, the dispatch center returns the electronic tool to the bank of units for another worker (or potentially the same worker) to use over a corresponding shift. Ideally, the amount of time the electronic tool is charge is long enough for the electronic tool to fully recharge or sufficiently recharge to last the next shift.

Unfortunately, sometimes the battery for the electronic tool is damaged or the recharge time is insufficient for the electronic tool. Thus, the battery fails during the worker's shift. When the battery fails, the worker needs to return to the dispatch center to obtain either a replacement battery or a replacement unit. This wastes a significant amount of time for the worker and drains company resources. Alternatively, each electronic tool could be provided with a backup battery; however, this also is an inefficient use of company resources if the electronic tool battery is capable of lasting an entire shift in the normal course. Battery failure during a worker's shift is inefficient during the best of cases, but the down time is exacerbated if the battery failure occurs during a particular job. Failure of the battery during a job may require the worker to secure the job site, travel to and from the dispatch center for a new battery, and re-open the job site.

One can appreciate the dispatch center described above is exemplary, and other types of battery operated electronic tools can exhibit similar issues. For example, instead of a dispatch center being responsible for recharging an electronic tool, the worker may have an electronic tool signed out to the worker and it is the worker's responsibility to ensure the electronic tool is recharged prior to being on the job. In this case, the worker does not obtain a tool at a central location, but starts the day with an electronic tool. However, the electronic tool can still experience battery failure. In those cases, the worker would still need to travel to a site to receive a replacement battery or have a replacement battery delivered to the job site so the worker can continue working.

Whether centralized or not, the failure of a battery for an electronic tool during a work shift interrupts the work shift and cases inefficiencies. Thus, it would be desirous to provide an electronic tool that alerted the worker whether the battery has sufficient charge for the entire shift.

SUMMARY

A method for managing a battery in an electronic device during use is provided. The method comprises initially determining an actual charge for a battery of the electronic device and estimating a power consumption requirement for a task to be performed. Once the actual charge and estimated power consumption is known, it s determined whether the actual charge for the battery is sufficient for the estimated power consumption. If it is determined that the actual charge for the battery is not sufficient, providing a warning of insufficient battery.

A method is also provided for managing a battery in an electronic device during use comprising estimating power needed by an electronic device to complete a task and determining the power remaining in a battery of the electronic device. The estimated power needed is compared to the power remaining to determine whether sufficient power remains in the battery. If it is determined that sufficient power does not remain in the battery, the power requirements of the electronic device are reduced by reducing or eliminating functions.

Also provided is a electronic device capable of managing power requirements and monitoring a battery status, the device includes a battery and processor. The processor monitors a battery charge and estimates a required charge needed by the electronic device to complete any task or job shift. When the processor determines the battery charge is insufficient, the processor applies business rules to reduce and terminate functions of the electronic tool to conserve power.

BRIEF DESCRIPTION OF THE DRAWINGS

Features, objects, and advantages will become apparent from the detailed description set forth below when taken in conjunction with the drawings in which like reference characters identify correspondingly throughout and wherein.

DETAILED DESCRIPTION

While the below description generally describes electronic tools distributed to workers at a central dispatch center, one of ordinary skill in the art on reading the disclosure would now recognize numerous environments that may exist. For example, instead of an electronic tool, the battery management system may be installed in golf cart or the like to ensure the golf cart has sufficient battery charge to propel a golfer along an expected distance for 18 holes of golf.

Figure 1:
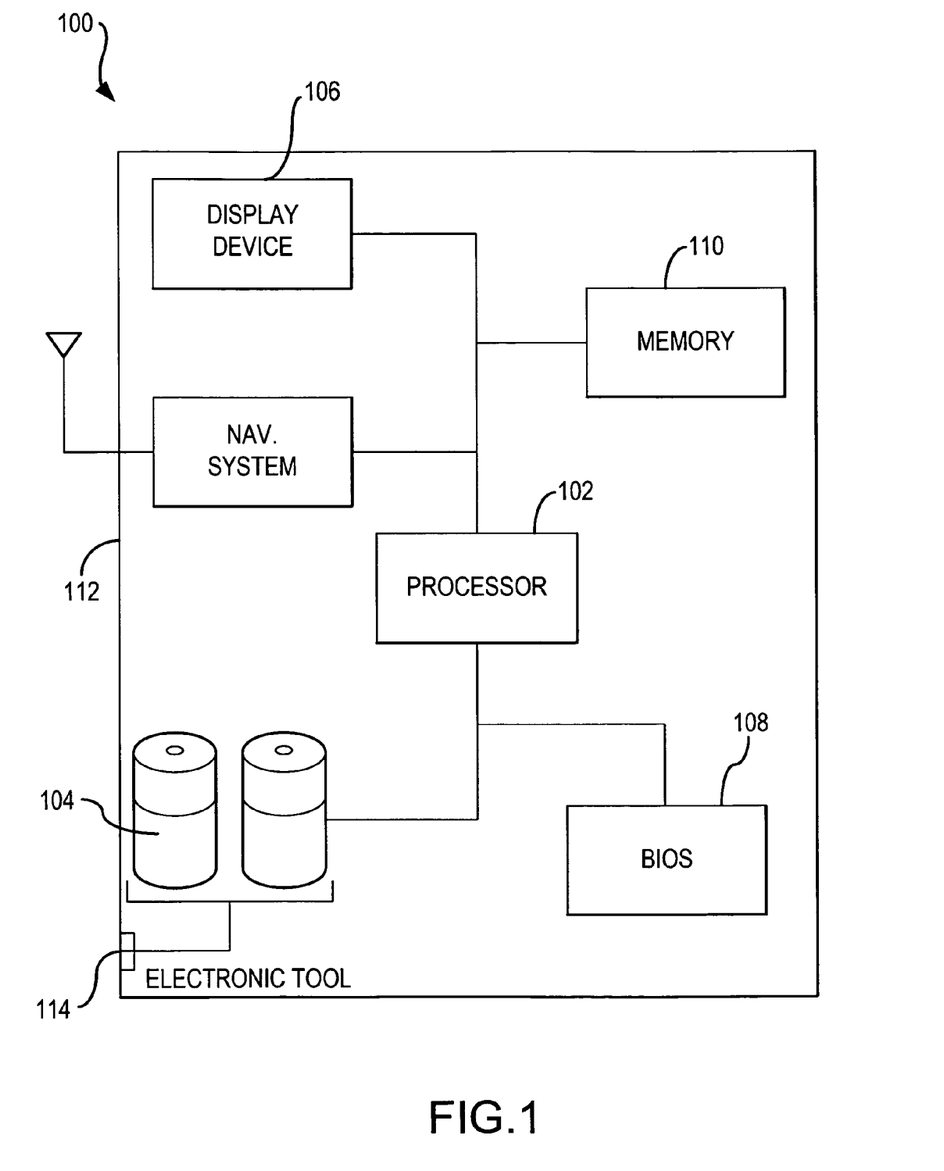
FIG. 1 is a block diagram of an electronic tool.

Referring to FIG. 1, a block diagram of an electronic tool 100 is shown. Electronic tool 100 may be, for example, a portable digital assistant, an pager, a cellular telephone, a handheld computer, or the like. Electronic tool 100 should be construed broadly however, and can encompass many other electronic devices, such as, for example, an electronic game, a vehicle battery, an mpg player, such as, for example, IPOD® from Apple Computer, or the like. Electronic tool 100 would include a processor 102, one or more batteries 104, and a display device 106. Depending on the complexity of electronic tool 100, it also may contain a basic input and output system ("BIOS") 108. BIOS 108 may include a keypad, a punch pad, a graphical user interface, a bar code scanner, or the like. Display device 106 may be a simple light indicator, such as a laser diode or light emitting diode, or could be a more complex display device, such as a flat screen display or the like. While display device 106 is shown as a single unit, display device 106 may comprise multiple units, such as, for example, speaker to provide an audio indication and a flat screen to provide visual displays, etc. Moreover, display device 106 could be provide audio signals instead of visual signals, as will be explained in more detail below. Memory 110 is connected to processor 102. Electronic tool 100 would additionally have other circuitry and components necessary for performing its intended functions. For example, many electronic tools today have a navigation system 112. Navigation system 112 would communicate with, for example, a global positioning satellite (not specifically shown but generally known in the art) to determine its location. Electronic tool 100 may periodically broadcast its location to a dispatch center (also not shown, but generally known in the art). The additional circuitry and components for the different tools are well known in the art and need not be further explained.

As shown, battery 104 is connected to a recharge port 114. Recharge port 114 may be a plug to connect to a power source, such as, for example, a wall socket, a car lighter, or the like, or recharge port may be contacts to match with contacts in a corresponding tool holster.

Processor 102 can be for example, microchips, chip-sets, processors, or the like capable of executing computer-executable instructions. Executable instructions include, for example, program modules generally comprising routines, programs, objects, components, and data structures, to perform particular tasks or manipulate data.

Figure 2:
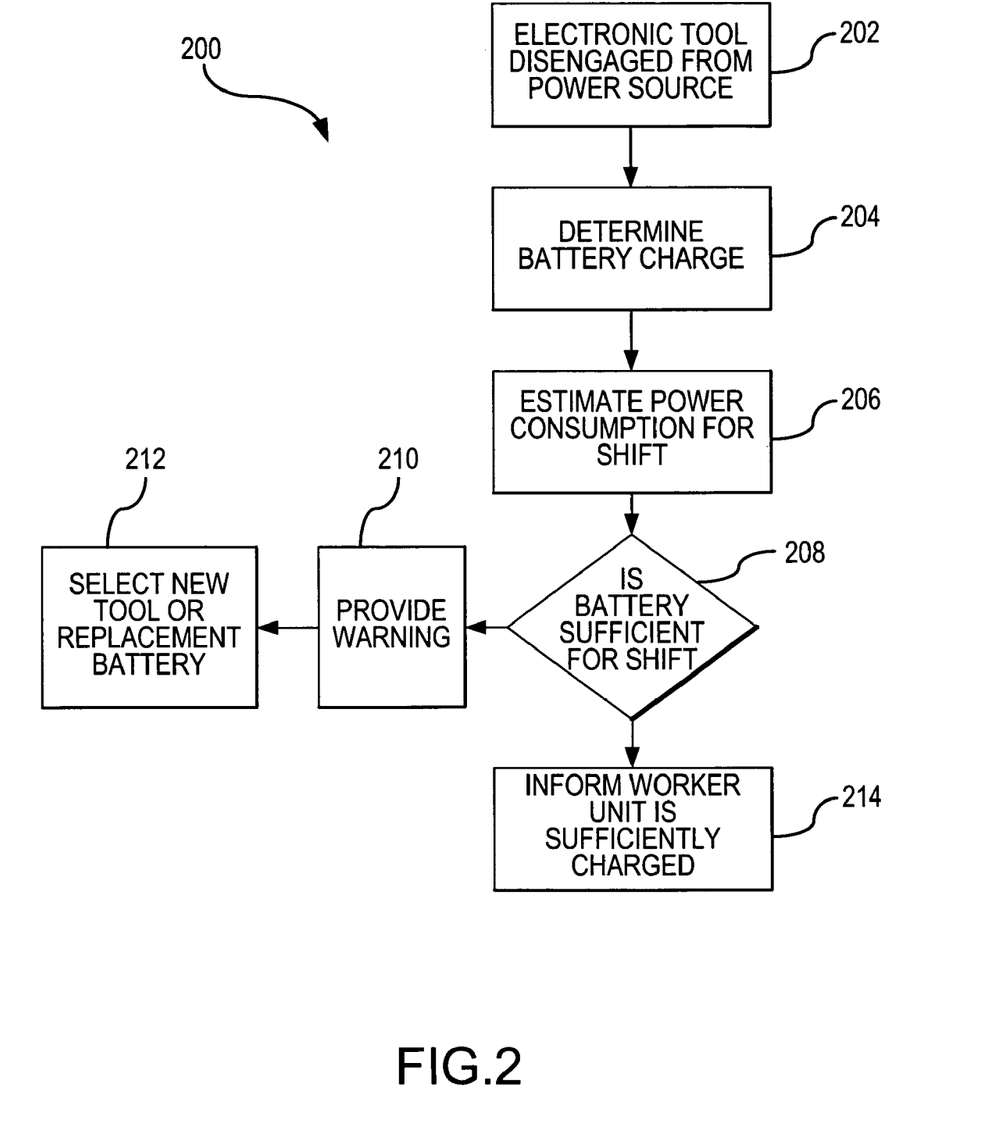
FIG. 2 is a flowchart illustrating a method of operating the system of FIG. 1.

Referring now to FIG. 2, a flowchart 200 showing operation when a worker selects an electronic tool at the beginning of a job or shift. First, an electronic tool 100 is disengaged from the power source by interrupting the connection at recharge port 114, step 202. Disengagement from a power source is an optional step as the battery management system described herein operates whether the electronic tool is initially connected to a power source or not. Disengagement from the power source may be sensed automatically by sensing battery discharge, manually by a switch, automatically by a motion sensor, or other sensor whether in or out of the device. Whether disengagement is sensed or not, processor 102 makes an initial determination of total battery charge, step 204. For example, processor 102 may determine battery charge at a percentage of full charge, an amount of total energy stored, or the like. Next, processor 102 would estimate power consumption for the work shift or task, step 206. For example, when a user may input a specific task, and processor 102 could calculate the estimated power consumption for that specific task based on known task specific activities. Alternatively, the task may have a specific power requirement stored in memory 110 that processor 102 retrieves too estimate the power consumption. These methods of determining estimated or actual power consumption are exemplary and non-limiting. Processor 102 could calculate power consumption in a number of known manners. For example, processor 102 may store in memory 110 historical information regarding power consumption during work shifts. Processor 102 may use the historical information to calculate an average shift power consumption. Because electronic operation may degrade over time, processor 102 may calculate power consumption using historical information using a weighted average factoring more recent information more heavily. Moreover, some job shifts may use an unusually high or low power rate, those shifts may be completely discounted. Processor 102 also may have an expected power consumption for a particular job assignment. For example, job 1 may use 92% of full battery charge on average. Job 1's power requirements would be stored in memory 110. When worker 1 selects electronic tool 100, they would enter job 1 on BIOS 108. Processor 102 would retrieve the power requirements stored in memory for job 1, which would be 92%.

To increase the accuracy of the estimated power consumption, known events during a job shift or task may be used by processor 102. For example, a particular task may require 6 device locating events during the course of the job. Processor 102 may be programmed with the knowledge that 6 locating events consumes 32% of battery charge. Thus, because processor 102 may be preprogrammed with specific events for a given job shift or task, forecasting required battery charge becomes more accurate.

Once the actual battery charge is known, and the estimated or forecasted power consumption is known, processor 102 would compare the two values to ensure the battery has sufficient charge for the estimated power for the job or shift, step 208. If the battery charge is insufficient, processor 102 causes display 106 to provide a warning to the worker, step 210. In other words, if expected power consumption is 50% full battery charge, and the battery is charged to 40%, a warning of insufficient charge is provided at display 106, which could be a text message, a tone, a warning light, or a combination thereof. If the worker is close to or at a dispatch center (for example), the worker can either obtain a new electronic tool, with sufficient charge, or obtain a replacement battery pack, step 212.

If it is determined the charge is sufficient for the expected use, processor 102 does may provide a go or ok signal at display 106, step 214, although a lack of warning could indicate the device is sufficiently charge. A positive indication, however, is beneficial as no indication could be because the checking system was faulty. Notice, for a margin of safety, processor 102 could be designed that the minimum charge required for each battery be at least 5% more power than expected.

Optionally, processor 102 and display device 106 could provide grades of sufficient charge (or lack thereof). For example, assume a job or work shift requires an electronic tool with a battery having a minimum 60% full charge. If the processor determines the battery charge is within a first predetermined range, such as 62% to 67% full charge, a first indication may be provided showing the battery has the minimum charge to function for the job or work shift. In this instance, the worker may elect to use the current tool, or the worker may elect to select a different tool with a better charge. If the processor determines the battery charge is within a second predetermined range, such as 67% to 80% full charge, a second indication may be provided showing the battery is charged above the minimum required charge, but still not fully charged. If the processor determines the battery charge is within a third predetermined range, such as 80% to % 100 full charge, a third indication may be provided showing the battery is charged to the maximum capacity. Of course, in the above example, a battery charge of 62% full capacity or less would receive an insufficient charge warning. The ranges provided and number of ranges are exemplary and non-limiting.

Figure 3:
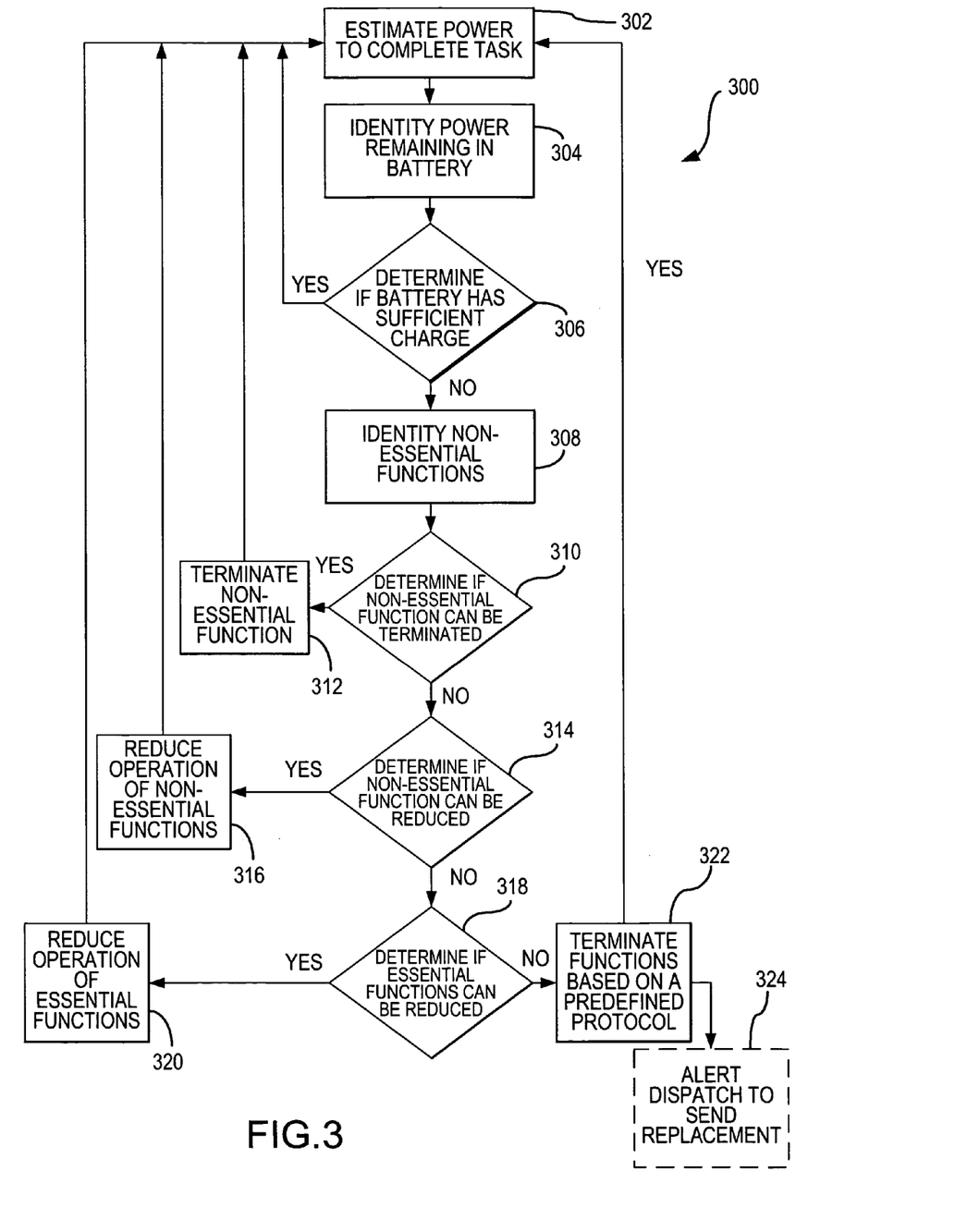
FIG. 3 is a flowchart illustrating a method of operating the system of FIG. 1.

Referring now to FIG. 3, a flowchart 300 showing operation of a selected electronic tool is provided. First, during the job or shift, the electronic tool calculates an estimated power consumption until job or shift completion, step 302. Estimated power consumption to complete a job could be based on actual power consumption requirements of the operating device. However, absent a monitor of actual power consumption, the estimates could be inferred based on known methodologies, such as, on the amount of charge the battery changes over time. Estimates of power consumption could be based on historical information as well.

Next, the total charge remaining in the battery is identified, step 304. Once the estimated power required and the total power remaining are known, they are compared to determine whether the battery charge is sufficient to complete the job or shift, step 06. If sufficient charge is available, the process continues repeats steps 302-306.

If it is determined that the battery does not have sufficient charge to complete the job or task, processor 102 identifies non-essential functions of the electronic tool, step 308. If one or more non-essential functions are identified, which would be based on preprogrammed information, processor 102 determines whether the non-essential functions can be terminated, step 310. If one or more non-essential function can be terminated, processor 102 terminates the function, step 312, and returns control to step 302 to determine if termination of non-essential functions was sufficient to provide enough battery energy to last the job or shift. Non-essential functions can be terminated one-by-one or in a batch as a matter of design choice.

If no non-essential functions can be terminated or once all the non-essential functions that can be terminated are terminated, and power consumption still needs to be reduced, processor 102 would next determine whether certain functions can be reduced, step 314. Those functions that can be reduced are reduced, step 316. For example, in the normal course, navigation system 112 may check and broadcast location information every 10 minutes. Processor 102 may determine this is a non-essential feature that can be reduced to once an hour. Once features are reduced, which can again be a one-by-one consideration or batch reduction, control is returned to step 302 to determine if the reduction was sufficient. Notice, termination of non-essential functions and reduction of the functions could be reversed in order.

If the termination and reduction of non-essential functions is an insufficient power reduction, processor 102 would next determine whether the remaining functions could be reduced in frequency, step 318. If additional functions can be reduced, those functions are reduced, step 320, and control is passed to step 302 for recalculation. Again, reduction of these functions could occur in any order. For example, text messaging may be considered an essential function. Text messaging, however, could be batch transmitted every few minutes instead of a continuous If after termination of non-essential functions, reduction of non-essential and essential functions, processor 102 would terminate the remaining functions based on a predefined priority, step 322. Optionally, if power consumption cannot be adequately managed by reducing and/or eliminating functions, processor 102 may transmit a signal to a dispatch center or user to deliver or obtain a replacement unit or replacement battery, step 324.

Figure 4:
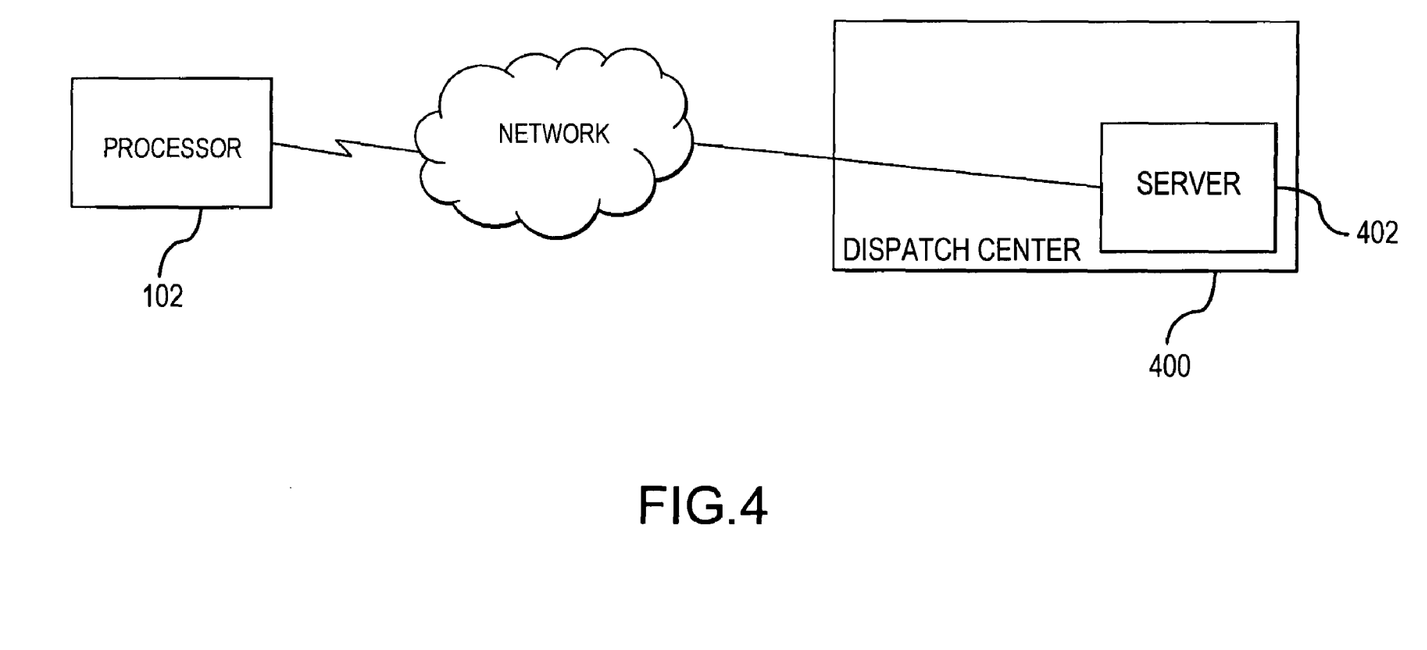
FIG. 4 is a block diagram of a system.

While shown as a local operation on electronic tool 100, processor 102 may gather data and transmit the data to a server 402 (see FIG. 4) at a dispatch center 400. Server 402 would be connected to electronic tool via any conventional communication protocol and network 404, such as, for example, a cellular telephone network, a radio network, other wireless networks, a PSTN, Internet, LAN, WAN, WLAN, WiFi, or the like.

Figure 5:
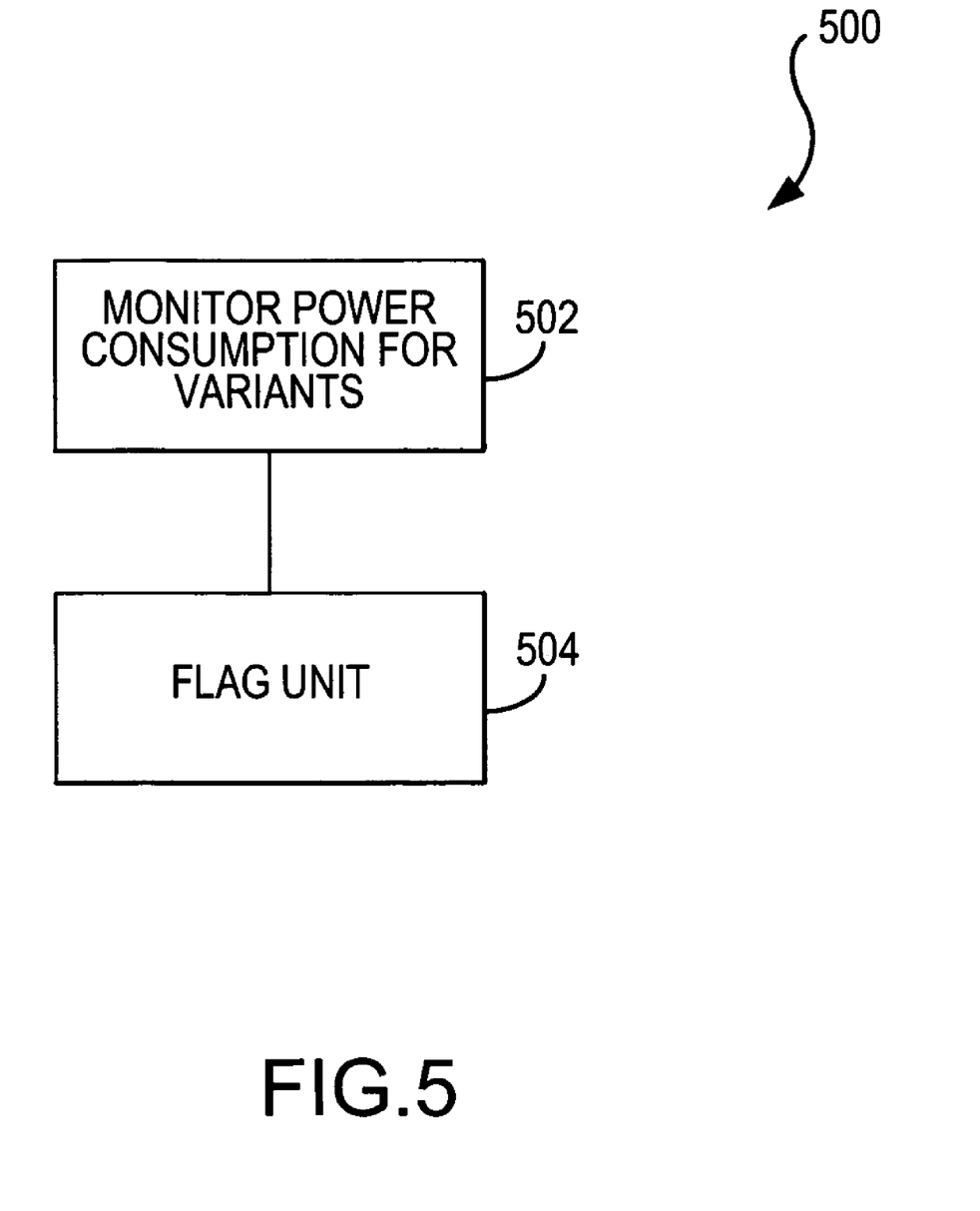
FIG. 5 is a flowchart illustrating a method of operating the system of FIG. 1.

While expected power consumption rates and actual power consumption rates will have variation, processor 102 (or server 402 in the appropriate systems) will monitor battery discharge for variants as well, step 502. Such variants may be, for example, an unusually large power surge, which may indicate an intermittent short in the device, or a device that averages a higher power consumption than other units operating in similar job or shift environments. When processor 102, server 402, or some combination thereof notes either large discharges or high average power consumption, a flag is set, step 504. Setting a flag provides a maintenance report or item for the electronic tool to be checked for problems.

The invention claimed is:

1. A method, comprising:
   determining an actual charge for a battery of an electronic device to be powered by the battery;
   estimating a power consumption requirement for a task to be performed by the electronic device based on a weighted average of a plurality of historical data points regarding actual power consumption of the electronic device for completing the task, wherein a weight factor assigned to each of the historical data points is inversely correlated to an age of the historical data point;
   determining whether the actual charge for the battery is sufficient for the estimated power consumption; and
   if it is determined that the actual charge for the battery is not sufficient, providing a warning of insufficient battery charge.

2. The method of claim 1 further comprising:
   determining an initial charge in response to removal of the electronic device from a power source, wherein said determining whether the actual charge for the battery is sufficient for the estimated power consumption further includes determining whether the initial charge is sufficient.

3. The method of claim 2, and further comprising monitoring a discharge rate from a battery to detect said removal of said electronic device from said power source.

4. The method of claim 2, and further comprising detecting said removal of said electronic device from said power source responsive, at least in part, to a switch.

5. The method of claim 2, and further comprising detecting removal of said electronic device from said external power source responsive, at least in part, to a motion sensor.

6. The method of claim 1, further comprising:
   estimating charge needed to complete the task to be performed by the electronic device;
   determining charge remaining in the battery;
   determining whether said charge remaining in the battery is sufficient to power the electronic device based, at least in part, on the estimated power needed; and
   if it is determined that sufficient charge does not remain in the battery, reducing the operation of at least one function of the electronic device in response to a determination that sufficient charge does not remain in the battery.

7. The method of claim 6, further comprising:
   terminating at least one function of the electronic device in response to a determination that sufficient charge does not remain in the battery.

8. The method of claim 6, further comprising identifying essential and non-essential functions and reducing the operation of non-essential functions before reducing the operation of essential functions.

9. The method of claim 6, further comprising sending an alert to a dispatch center to deliver a new battery or a new electronic device.

10. The method of claim 1, further comprising:
terminating at least one function of the electronic device in response to a determination that sufficient charge does not remain in the battery.

11. The method of claim 10, further comprising identifying essential and non-essential functions and reducing the operation of non-essential functions before reducing the operation of essential functions.

12. The method of claim 1, further comprising:
monitoring the electronic device for unusual power consumption variants; and
flagging the electronic tool for maintenance if power consumption variants are discovered.

13. The method of claim 12, wherein power consumption variants include large power discharges.

14. The method of claim 12, wherein power consumption variants include a history of requiring more power than comparable tools performing comparable tasks.

15. The method of claim 1, wherein the electronic device is powered solely by the battery.

16. A method comprising:
estimating power needed by an electronic device powered by a battery to complete a task based on a weighted average of a plurality of historical data points regarding actual power consumption of the electronic device for completing the task, wherein a weight factor assigned to each of the historical data points is inversely correlated to an age of the historical data point;
determining charge remaining in the battery of the electronic device;
determining whether sufficient charge remains in the battery based, at least in part, on the estimated power needed; and
reducing the power requirements of the electronic device in response to a determination that the battery does not have sufficient charge for the electronic device to complete the task.

17. The method of claim 16, further comprising:
reducing the operation of at least one function of the electronic device in response to a determination that said battery does not have sufficient charge for said electronic device to complete said task.

18. The method of claim 17, further comprising identifying essential and non-essential functions and reducing the operation of non-essential functions before reducing the operation of essential functions.

19. The method of claim 16, further comprising:
terminating at least one function of the electronic device in response to a determination that said battery does not have sufficient charge for said electronic device to complete said task.

20. The method of claim 19, further comprising identifying essential and non-essential functions and terminating the operation of non-essential functions before reducing the operation of essential functions.

21. The method of claim 16, further comprising:
terminating at least one function of the electronic device in response to a determination that said battery does not have sufficient charge for said electronic device to complete said task.

22. The method of claim 16, further comprising sending an alert to a user to deliver a new battery or a new electronic device.

23. An electronic device capable of managing power requirements and monitoring a battery status, the device comprising:
a battery;
a processor that monitors a battery charge and estimates a required charge needed by the electronic device to be powered by the battery to complete a task based on a weighted average of a plurality of historical data points regarding actual power consumption of the electronic device for completing the task, wherein a weight factor assigned to each of the historical data points is inversely correlated to an age of the historical data point; and
the processor further determines whether the battery has sufficient charge to complete the task, wherein the processor reduces functions provided by the electronic device to conserve power in response to the determination that the battery does not have sufficient charge for the electronic device to complete the task.

24. The electronic device of claim 23, wherein the processor reduces nonessential functions before essential functions.

25. The electronic device for claim 24, further comprising a sensor to detect removal of the electronic device from an external power source, and if the electronic device is removed from the external power source, the processor determines an estimated charge required to complete the task by the electronic device.

26. The electronic device of claim 25 further comprising a display device so that if power is insufficient to complete the task by the electronic device, the display device displays a warning.

27. The electronic device of claim 23, wherein the processor terminates non-essential functions before essential functions.

28. An apparatus comprising:
means for determining an actual charge for a battery of an electronic device to be powered by the battery;
means for estimating a power consumption requirement for a task to be performed by the electronic device based on a weighted average of a plurality of historical data points regarding actual power consumption of the electronic device for completing the task, wherein a weight factor assigned to each of the historical data points is inversely correlated to an age of the historical data point;
means for determining whether the actual charge for the battery is sufficient for the estimated power consumption; and
means for providing a warning of insufficient battery charge if it is determined that the actual charge for the battery is not sufficient.

29. The apparatus of claim 28 further comprising:
means for determining an initial charge in response to removal of the electronic device from a power source, wherein said determining whether the actual charge for the battery is sufficient for the estimated power consumption further includes determining whether the initial charge is sufficient.

30. The apparatus of claim 29, and further comprising:
means for monitoring a discharge rate from a battery to detect said removal of said electronic device from said power source.

31. The apparatus of claim 29, and further comprising:
means for detecting said removal of said electronic device from said power source responsive, at least in part, to a switch.

32. The apparatus of claim 28, wherein the electronic device is powered solely by the battery.

33. An article comprising a storage medium comprising machine-readable instructions stored thereon which, if executed by a computing platform, cause the computing platform to:
- determine an actual charge for a battery of an electronic device to be powered by the battery;
- estimate a power consumption requirement for a task to be performed by the electronic device based on a weighted average of a plurality of historical data points regarding actual power consumption of the electronic device for completing the task, wherein a weight factor assigned to each of the historical data points is inversely correlated to an age of the historical data point;
- determine whether the actual charge for the battery is sufficient for the estimated power consumption; and
- provide a warning of insufficient battery charge if it is determined that the actual charge for the battery is not sufficient.

34. The article of claim 33, wherein the machine-readable instructions, if executed by the computing platform, further cause the computing platform to:
- determine an initial charge in response to removal of the electronic device from a power source, wherein determining whether the actual charge for the battery is sufficient for the estimated power consumption further includes determining whether the initial charge is sufficient.

35. The article of claim 34, wherein the machine-readable instructions, if executed by the computing platform, further cause the computing platform to:
- monitor a discharge rate from a battery to detect the removal of the electronic device from the power source.

36. The article of claim 34, wherein the machine-readable instructions, if executed by the computing platform, further cause the computing platform to:
- detect the removal of the electronic device from the power source responsive, at least in part, to a switch.

37. The article of claim 33, wherein the electronic device is powered solely by the battery.

* * * * *